US005111266A

United States Patent [19]

Furumura et al.

[11] Patent Number: 5,111,266
[45] Date of Patent: May 5, 1992

[54] SEMICONDUCTOR DEVICE HAVING A REGION DOPED TO A LEVEL EXCEEDING THE SOLUBILITY LIMIT

[75] Inventors: Yuji Furumura; Fumitake Mieno, both of Kawasaki; Tsutomu Nakazawa, Yokohama; Takashi Eshita, Inagi; Mamoru Maeda, Tama; Tsunenori Yamauchi, Kawasaki, all of Japan

[73] Assignee: Fujitsu Limited, Japan

[21] Appl. No.: 714,367

[22] Filed: Jun. 12, 1991

Related U.S. Application Data

[63] Continuation of Ser. No. 320,650, Mar. 8, 1989, abandoned.

[30] Foreign Application Priority Data

Mar. 11, 1988 [JP] Japan .................................. 63-56119
Apr. 5, 1988 [JP] Japan .................................. 63-83834

[51] Int. Cl.$^5$ .................... H01L 29/167; H01L 29/72
[52] U.S. Cl. ........................................ 357/34; 357/16; 357/59
[58] Field of Search ........................... 357/59, 34, 16; 437/146, 160, 168

[56] References Cited

U.S. PATENT DOCUMENTS

| | | | |
|---|---|---|---|
| 3,988,760 | 10/1976 | Cline ........................... | 437/146 |
| 4,394,191 | 7/1983 | Wada et al. ................. | 437/146 |
| 4,523,370 | 6/1985 | Sullivan et al. ............. | 357/59 |
| 4,532,697 | 8/1985 | Ko ................................ | 357/59 |
| 4,857,480 | 8/1989 | Plante .......................... | 437/168 |

FOREIGN PATENT DOCUMENTS 3047342 10/1981 Fed. Rep. of Germany .
117464 5/1988 Japan .................... 357/34

OTHER PUBLICATIONS

Sudo, I. Jpn. J. Appl. Phys., vol. 19, No. 4, pp. 755-756, 1980.
Wadsten T. Acta Chem. Scand., vol. 19, No. 5, pp. 1232-1238, 1965.
Sawada, S. et al., IEICE Technical Report: SDM88-150, pp. 67-71, 1988.
Ho, K. K. et al., J. Appl. Phys., vol. 44, No. r, pp. 1895-1896, Apr. 1973.
Chu, T. I. et al., J. Appl. Phys., vol. 42, No. 3, pp. 1169-1173, Mar. 1971.
Chu, T. I. et al., "Electrical Properties of Melt Grown Silicon Monoarsenide", In: Solid Electronics, vol. 14, pp. 1259-1263, Pergamon Press, 1971.
Guerrero, E. et al., J. Electrochem. Soc.: Solid State Science and Technology, pp. 1826-1831, Aug. 1982.
Young, N. D. et al., J. Appl. Phys., vol. 61, No. 6, pp. 2189-2194, Mar. 1987.
Ing. S. W. et al., J. Electrochem. Soc.: Solid State Science, pp. 761-762.
Lewrenz, H. J. et al., J. Electrochem. Soc.: Accelerated Brief Communication, pp. 1228-1230, May 1983.
"Optical and Electrical Characterization of High-Dose Ion Implanted, Laser-Annealed Silicon Solar Cells", P.

(List continued on next page.)

Primary Examiner—Jerome Jackson, Jr.
Attorney, Agent, or Firm—Armstrong, Nikaido, Marmelstein, Kubovcik & Murray

[57] ABSTRACT

A bipolar transistor includes a base region made of silicon crystal doped with a first impurity to a first level so as to establish a first carrier concentration in the base region and an emitter region made of silicon crystal doped with a second impurity to a second level substantially larger than the first level by a predetermined factor so as to establish a second carrier concentration in the emitter region, in which the second impurity exceeds the solubility limit of the second impurity in silicon crystal. The first and second levels are chosen in such a range that a difference in the carrier concentrations between the emitter region and the base region decreases substantially with increasing impurity level in the base region.

9 Claims, 7 Drawing Sheets

OTHER PUBLICATIONS

Ostoja et al., Journal of Applied Physics, vol. 52, No. 10, Oct. 1981, pp. 6208–6213, Am. Inst. of Physics.

"Solid Phase Epitaxial Regrowth Phenomena in Silicon", J. S. Williams, Nuclear Instruments and Methods, vol. 209/210, 1983, pp. 219–228, North Holland Publishing Company.

"Nonequilibrium Solid Solutions Obtained by Heavy Ion Implantation and Laser Annealing", N. Natsuaki et al., Journal of Applied Physics, vol. 51, No. 6, Jun. 1980, pp. 3373–3382, Am. Inst. of Physics.

"Electrical Properties and Stability of Super-Saturated Phosphorus-Doped Silicon Layers", M. Finetti et al., Journal of the Electrochemical Society, vol. 128, No. 6, Jun. 1981, pp. 1313–1317, Princeton.

"High-Speed Self-Aligned Polysilicon Emitter/Base Bipolar Devices Using Boron and Arsenic Diffusion Through Polysilicon", Extended Abstracts of the 18th Conference on Solid State Devices and Materials, Tokyo, Aug. 20–22, 1986, pp. 729–731, Bus. Centre Acad. Socs., Tokyo.

"Simultaneous Boron and Hydrogen Profiling in Gas–Phase-Doped Hydrogenate Amorphous Silicon", P. M. Read et al., Thin Solid Films, vol. 110, No. 3, Dec. 1983, pp. 251–261, Elsevier Sequoia, Lausanne, CH.

"Incorporation of Dopan Into Amorphous Silicon and Thermoelectric Device", M. H. Brodksy et al., IBM Technical Disclosure Bulletin, vol. 23, No. 12, May 1981, pp. 5590–5592, New York.

SEMICONDUCTOR DEVICE HAVING A REGION DOPED TO A LEVEL EXCEEDING THE SOLUBILITY LIMIT

This application is a continuation of application Ser. No. 320,650 filed Mar. 8, 1989 now abandoned.

BACKGROUND OF THE INVENTION

The present invention generally relates to semiconductor devices and more particularly to a semiconductor device having a region doped with impurity to such a level that the concentration of the impurity exceeds the solubility limit of the region.

With ever increasing demand to improve the operational speed of transistors, efforts are made to manufacture a base region of bipolar transistor as thin as possible. By doing so, one can reduce the time for a carrier to move across the base region by diffusion. However, such a decrease in the thickness of the base region leads to an increase in the spreading resistance in lateral directions.

In order to cancel or compensate the effect of this increased spreading resistance, it is desired to increase the concentration of the impurities in the base region so that the resistance thereof is decreased. However, such an increase in the impurity in the base region has to be accompanied with corresponding increase in the impurity level in a corresponding emitter region which has an impurity level much higher than the impurity level of the base region. The impurity level of the emitter region is chosen such that the carrier density in the base region maintains an optimum proportion or ratio with respect to the carrier density in the emitter region.

When the impurity level in the emitter region becomes excessive, the emitter region is saturated with the impurity and there appears a precipitation of the doped impurity as separate phase. Thus, the impurity level in the base region is limited. When such a precipitate appears in the emitter region, the increase in the impurity or dopant does not contribute to the increase of the carrier density any more, and the proportion of the carrier density in the emitter region to that in the base region is deviated from the optimum ratio when the impurity level of the base region is increased. Further, such an existence of the precipitates in a host silicon crystal causes a scattering of carrier in the silicon and facilitates its recombination. Thus, such an increase in the impurity level in the base region is conventionally thought as a disadvantage.

For example, a conventional npn bipolar transistor has a base region having a thickness of about 3000 Å and the base region is doped with boron with a level of $5 \times 10^{17} - 1 \times 10^{18}/cm^3$. The transistor also has an emitter region doped with arsenic with a level of about $1 \times 10^{20}/cm^3$. When the thickness of the base region is reduced to about 1000–1500 Å, it is desired that the impurity level in the base region is increased to about $1 \times 10^{19}/cm^3$. As it is necessary to maintain the impurity level of the emitter region larger than that of the base region with a factor of about 1000, the corresponding arsenic concentration level in the emitter region should be in the order of $10^{22}/cm^3$. However, this level of the emitter region exceeds the solubility limit of arsenic in the silicon crystal at 1000° C. The value of the solubility limit is about $4 \times 10^{21}/cm^3$. Thus, the precipitates appears as already described when the emitter region is doped to such an impurity level. In order to avoid the various disadvantages accompanying the appearance of the precipitate, one has to limit the impurity level of the emitter region to a value substantially smaller than the solubility limit. However, by limiting the impurity level of the emitter region as such, the ratio of the carrier density in the emitter region to that of the base region is reduced to below 1000. With such a small difference in the carrier concentration level in the emitter and the base, the common emitter current gain of the transistor is expected to be reduced to lower than about 100. The excessive increase in the impurity level in the emitter also invites contraction of the band gap in emitter and such a contraction of the band gap also leads to the decrease of the common emitter current gain.

Meanwhile, semiconductor devices of various type are constructed on a silicon wafer, and such a semiconductor device uses doped single crystal or polycrystal silicon as a conductive region. For example, such a doped silicon is used as a gate electrode of a MOS transistor or a bit line of memory device. In a bipolar transistor, too, such a doped silicon conductive region is used as electrodes as well as a diffusion source layer which releases the impurity into the base region to form a shallow emitter region in the base.

Such devices are required to exhibit improved response or operational speed, and for this purpose, it is necessary to lower the resistivity of such a conductive region as much as possible so as to reduce the time constant of input and output signal path of the device formed by such a conductive region. For this purpose, it is desired to dope the impurity as much as possible. However, when the silicon is doped with impurity by diffusion from a source material contacting with the silicon as is practised conventionally, the level of the impurity to be introduced into the silicon is limited by the thermodynamic equilibrium at the boundary of the silicon and the source material. In other words, there is an upper limit in the level of impurity to be introduced into the silicon, and corresponding thereto, there is a lower limit in the resistivity of silicon. In the case of a polysilicon film having a thickness of about 4000 Å, the lowest possible surface resistivity is about 10 $\Omega/\square$.

Conventionally, various silicides are also used for the conductive region in order to achieve low resistivity. However, the formation of silicide requires heat treatment for a substantial time period and there is a substantial risk that such a heat treatment deteriorates the profile of the impurity distribution in the semiconductor device. Further, the silicides tend to be detached from the silicon substrate underneath. For example, the tungsten silicide requires heat treatment at 900° C. for a substantial period of time and is easily detached from the substrate.

SUMMARY OF THE INVENTION

Accordingly, it is a general object of the present invention to provide a novel and useful semiconductor device wherein the aforementioned problems are eliminated.

Another and more specific object of the present invention is to provide a high speed semiconductor device wherein the specific resistance of a conductive region thereof is substantially reduced.

Another object of the present invention is to provide a semiconductor device having a high operational speed, wherein the semiconductor device has a conductive region which is doped with impurity to a level exceeding the solubility limit of the impurity in the region. According to the present invention, the resistivity of the conductive region is substantially reduced and the delay in operation of the device due to the time constant of input and output signal path including the conductive region is minimized.

Another object of the present invention is to provide a high speed bipolar transistor having a base region with reduced thickness but still capable of providing a high common emitter current gain.

Another object of the present invention is to provide a bipolar transistor having an emitter region and a base region doped with respective impurities such that the impurity level of the emitter region is substantially larger than the impurity level of the base by a predetermined factor, wherein said base region is doped to such a level that the impurity level of the corresponding emitter region exceeds the solubility limit of the impurity in the emitter region. According to the present invention, a common emitter current gain exceeding about 600 is obtained even when the base region is doped to a level of $1 \times 10^{19}/cm^3$ and the emitter region is doped in correspondence thereto to a level of $1 \times 10^{22}/cm^3$ which substantially exceeds the solubility limit of the impurity in the emitter region. Such a result is quite contradictory to what is believed hitherto in bipolar transistor that the common emitter current gain should be decreased when the emitter region is saturated with the impurity.

Still another object of the present invention is to provide a method of manufacturing a semiconductor material containing an impurity to a level exceeding the solubility limit of the impurity in the semiconductor material in which the semiconductor material is formed as an amorphous material from source materials including the impurity, and the amorphous material is annealed at a temperature higher than at least about 600° C. to provide the semiconductor material. According to the present invention, the impurity is introduced easily into the amorphous material which is to be converted to the semiconductor material later by crystalization to a level substantially exceeding the solubility limit, and the semiconductor material thus obtained has a significantly low resistivity.

Other objects and further features of the present invention will become apparent from the following detailed description when read in conjunction with attached drawings.

DETAILED DESCRIPTION

First, the present invention will be described for a procedure of forming a silicon semiconductor material containing impurity exceeding the solubility limit of silicon.

Figure 1:
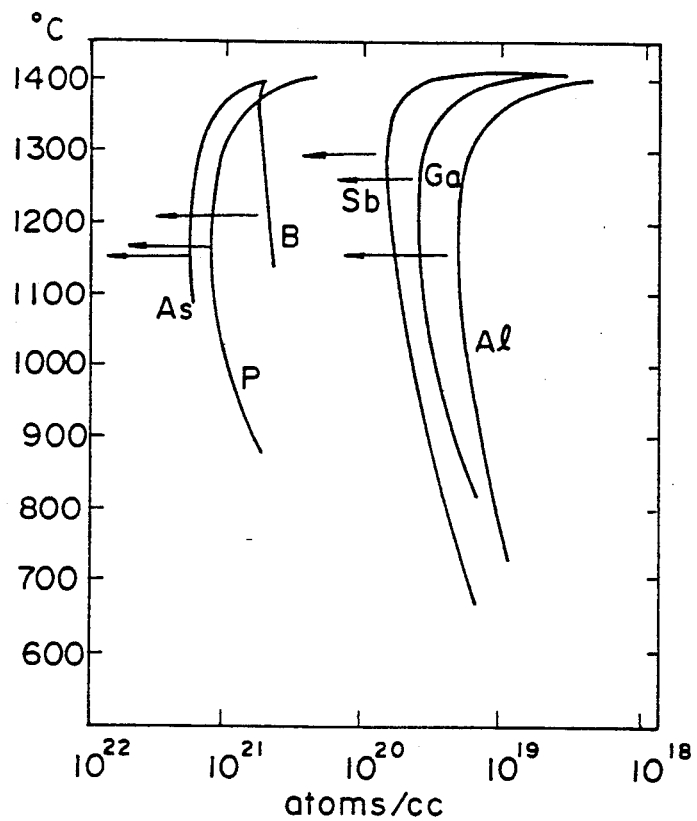
FIG. 1 is a phase diagram showing the solubility limit of various impurities in silicon crystal.

FIG. 1 shows the solubility limit of various elements in silicon (crystalized phase) in the temperature range of 600 to 1400° C. Referring to the drawing, the solid line represents the phase boundary between a single phase region containing the silicon phase alone and a multi-phase region containing the silicon and the precipitate. In the drawing, the left hand side of the phase boundary represents the multi-phase region and the right hand side of the phase boundary represents the region of single phase silicon.

As a procedure to form a silicon based semiconductor material containing impurity to a level exceeding the solubility limit of silicon, conventionally used solid diffusion technique which introduces the impurity by solid diffusion is not appropriate. This is because the maximum impurity level possible to be reached by such a procedure is limited by the thermodynamic equilibrium of the impurity source and the semiconductor material to be doped. In other words, the impurity level exceeding the solubility limit cannot be reached by the solid diffusion technique.

Ion implantation is a useful technique to introduce impurity of a desired impurity to a semiconductor material. However, there is a case in which it is desired to form a doped semiconductor over a large surface. In such a case, it is preferred to grow the silicon material containing impurity to such a level from the beginning.

The applicants studied various procedures to grow semiconductor material doped with impurity with a level exceeding the solubility limit over the surface of a silicon substrate. In any of these procedures, it was found that it is preferable to form amorphous silicon phase as an intermediate phase when adding the impurity beyond the solubility limit of crystalline silicon. In the case of ion implantation, too, it is well known that the amorphous phase appears when the ion implantation is made even if the amount of dose not exceed the solubility limit.

There are several known methods of growing the amorphous silicon phase on the silicon substrate or on other semiconductor device structures. For example, the plasma CVD method or the photo assisted CVD method are the well known technique. However, the plasma CVD method, using hydrogen as a carrier gas, requires heat treatment in order to expel the hydrogen molecule from the formed amorphous silicon, and there is a substantial risk that such a heat treatment causes change in the profile of the impurity distribution in various parts of semiconductor device. The photo assisted CVD method has a possibility that the deposition rate changes with the proceeding of reaction due to the deposition of material on an inner wall of a reaction chamber and the reaction becomes incomplete.

Figure 2:
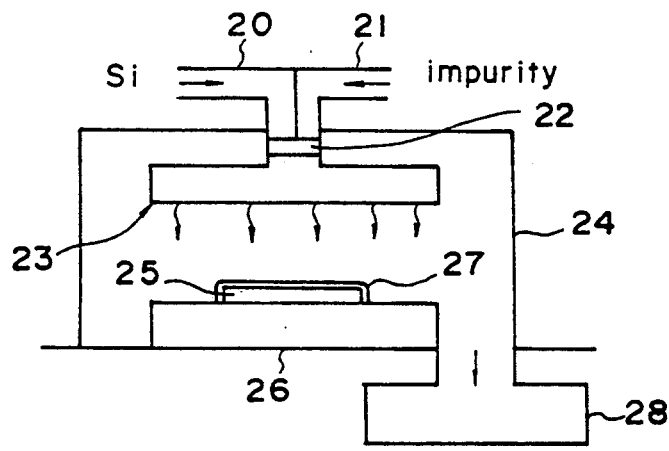
FIG. 2 is a diagram schematically showing an apparatus used for growing an amorphous silicon material in which impurities are added to a level exceeding the solubility limit of silicon crystal.

Atmospheric pressure CVD method and low pressure CVD method are advantageous as they do not suffer from these limitations. FIG. 2 shows an apparatus used for growing an amorphous silicon material having a high level impurity by a pyrolitic CVD procedure. Referring to the drawing, a source gas containing silicon is introduced from a first inlet conduit 20 and an impurity gas is introduced from a second inlet conduit 21. The gases thus introduced are mixed one another by a mixer 22 and a gas mixture is formed. The gas mixture is then introduced into a reaction chamber 24 through a gas inlet 23. In the reaction chamber 24, a silicon wafer or substrate 25 on which a region having the impurity level exceeding the solubility limit is to be formed is placed on a stage or holder 26. As a result of pyrolysis of the gas mixture, amorphous silicon including impurity exceeding the solubility limit is grown on the surface of the substrate 25 as a film 27. The residual gas remained after the pyrolysis is evacuated from the reaction chamber 24 by an evacuating system 28. By increasing the proportion of the impurity gas relative to the proportion of the source gas of silicon, the impurity exceeding the solubility limit in silicon is easily added to the amorphous silicon phase and a homogeneous distribution of the impurity in the amorphous silicon is achieved.

The amorphous silicon phase 27 is preferably grown in the temperature range of 350° C. to 550° C., more preferably in the temperature range of 350° C. to 540° C. The source gas containing silicon may be monosilane $SiH_4$, disilane $Si_2H_6$ or trisilane $Si_3H_8$ which decomposes at a low temperature. The impurity gas is a gas containing elements of group III or group V, and a hydride of a group III or group V element is preferred. When doping arsenic, the gas may be arsenic hydride $AsH_3$. When doping boron or phosphorus, diborane $B_2H_6$ or phosphine $PH_3$ may be used as the impurity gas.

The amorphous silicon thus obtained contains the impurity exceeding the solubility limit in the crystalline silicon. However, the impurity in such an amorphous phase is not in the active state. In other words, the impurity element is not settled in the site of silicon in the silicon crystal structure and therefore the carrier is not released. In order to make the impurity to occupy the site of silicon atom of the crystal structure, it is necessary to anneal the amorphous phase so that the amorphous phase crystalizes. This annealing is preferably made in the temperature range of about 600° C. or more. When the anneal is made at 600° C., the annealing time is about 1-10 hours. As a result of annealing, the silicon is crystalized and the silicon is no longer able to contain the impurity exceeding the solubility limit. Thus, the impurity is precipitated as a compound of the impurity element and silicon. When the impurity is arsenic, the precipitate is silicon arsenide ($SiAs_x$).

In a series of experiments for preparing various semiconductor materials saturated with impurity, the applicants found that such a semiconductor material has a significantly low resistivity which is much lower than the hitherto achieved resistivity of the doped polysilicon. The followings are examples of the semiconductor material obtained by the pyrolitic CVD technique described above.

EXAMPLE 1

An amorphous silicon material is grown on a silicon substrate under reduced pressure using the apparatus of FIG. 2. The holder 26 is held at a temperature of 450° C., and the pressure of the reaction chamber 24 was set to 1 Torr. From the inlet conduit 20, a disilane ($Si_2H_6$) gas was introduced with a flow rate of 20 cc/min, and a hydrogen-diluted diborane gas (1% $B_2H_6/H_2$) was supplied from the conduit 21 with a flow rate of 80 cc/min. The amorphous silicon was grown on the holder 26 until its thickness reaches about 4000 °Å. The amorphous silicon was then annealed as already described and the silicon crystal thus obtained was subjected to resistivity measurement. As a result, a resistivity of about $8 \times 10^{-4}$ Ωcm is obtained. This value is at least lower than the lowest possible resistivity of polysilicon conventionally achieved which is in the order of $10^{-2} - 10^{-3}$ Ωcm.

EXAMPLE 2

An amorphous silicon material is grown on a silicon substrate under reduced pressure using the apparatus of FIG. 2. The holder 26 is held at a temperature of 450° C., and the pressure of the reaction chamber was set to 1 Torr similarly to the case of EXAMPLE 1. From the inlet conduit 20, the disilane gas is introduced as the source gas with the flow rate of 10.3 cc/min, and from the inlet conduit 21 the phosphine gas was introduced with the flow rate of 0.3 − 0.4 cc/min using hydrogen as the carrier gas. After annealing as described, the material thus obtained showed a resistivity of about $5 \times 10^{-4}$ Ωcm which is lower than the resistivity of the conventional polysilicon at least by a factor of ten.

EXAMPLE 3

An amorphous silicon material is grown on a silicon substrate under reduced pressure using the apparatus of FIG. 2. The holder 26 is held at a temperature of about 600° C., and the pressure of the reaction chamber 24 was set to 1 Torr. From the inlet conduit 20, the disilane gas was introduced with a flow rate of 500 cc/min, and a 100% arsenic hydride ($AsH_3$) gas was supplied from the conduit 21 with a flow rate of 50 cc/min. The amorphous silicon was grown on the holder 26 until its thickness reaches about 4000 Å. The amorphous silicon was then annealed as already described and the silicon crystal thus obtained was subjected to resistivity measurement. As a result, a resistivity of about $1 \times 10^{-4}$ Ωcm is obtained. This value is comparable to the resistivity of the material obtained in the EXAMPLE 2 and substantially lower than the resistivity of polysilicon conventionally obtained.

Figure 3:
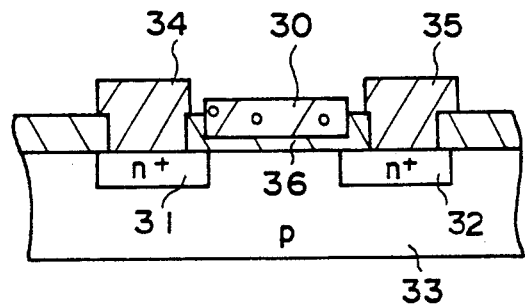
FIG. 3 is a cross sectional view showing a structure of a MOS transistor in which a semiconductor material containing the impurity to a level exceeding the solubility limit is used for a gate electrode.

Using such a semiconductor material having low resistivity for a gate of a MOS transistor, one can realize a high operational speed of the transistor. FIG. 3 shows an example of such a MOS transistor in the case of n-channel type. Referring to the drawing, a gate electrode 30 is made from the semiconductor material doped with impurity exceeding the solubility limit of silicon. As usual in the MOS transistor design, a source region 31 and a drain region 32 are formed in a p-type substrate 33 on both sides of the gate electrode 30. Further, electrodes 34 and 35 are formed on the source region 31 and the gate region 32 respectively. The gate electrode 30 is separated from the substrate 33 by a gate insulator layer 36. In the MOS transistor of FIG. 3, the time constant of a signal path including the gate electrode 30 at the gate of the transistor is reduced and the delay of response due to the time constant of the signal path is reduced. Further, when it was the case that the reduction of the resistivity is not critical, one can reduce the thickness of the gate electrode.

Figure 4:
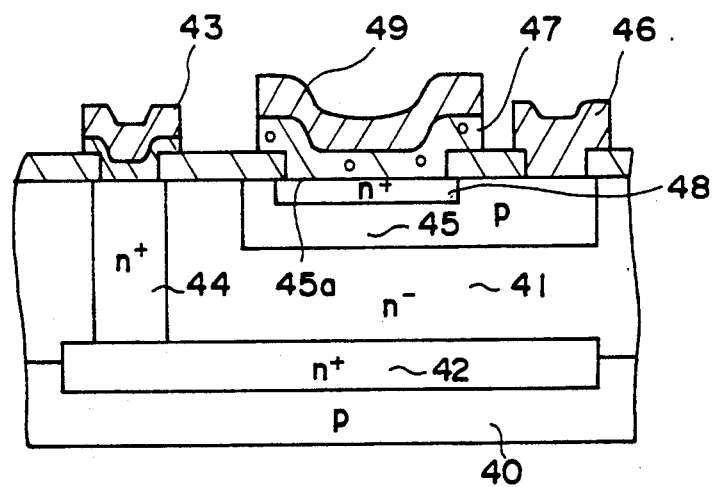
FIG. 4 is a cross sectional view showing a structure of a bipolar transistor in which the semiconductor material containing the impurity to the level exceeding the solubility limit is used as a diffusion source layer for releasing the the impurity to form a shallow emitter region.

FIG. 4 shows a structure of a bipolar transistor using the semiconductor material as a source of impurity to be incorporated into the emitter region. Referring to the drawing, a collector region 41 doped to a n⁻-type is formed epitaxially in a p-type silicon substrate 40, and a buried collector layer 42 doped to a n⁺-type is formed at a boundary between the collector region 41 and the substrate 40. Further, the buried collector layer 42 is connected to a collector electrode 43 at the surface of the transistor structure via a n⁺-type diffusion region 44 extending through the epitaxial collector region 41. In the collector region 41, a p-type base region 45 is formed. This p-type base region 45 makes contact with a base electrode 46. On L a surface 45a of the base region 45, an impurity source region 47 is grown in accordance with the procedure described previously. In other words, this impurity source region 47 has an impurity level exceeding the solubility limit. On the region 47, an electrode 49 is deposited for external connection. From this region 47, the impurity is diffused into the p-type base region 45 for a minute distance across the surface 45a and a shallow emitter region 48 doped to the n⁺-type is formed. In such a structure, the resistivity of the region 47 is substantially reduced and the operational speed of the bipolar transistor is improved.

When manufacturing the bipolar structure of FIG. 4, one can deposit the amorphous silicon containing the impurity exceeding the solubility limit of silicon on the base 45 and apply a heat treatment at a temperature of about 800° C. During this heat treatment, the impurity is released from the source region 47 and the emitter 48 is formed. At the same time, the amorphous silicon is crystalized and its resistivity is significantly reduced. The temperature of heat treatment of 800° C. is sufficient for forming the emitter region 48 with sufficient impurity level. In contrast, a temperature of about 900° C. is required when using a conventional polysilicon. Thus, the use of the semiconductor material of the present invention enables the construction of a bipolar transistor having an extremely shallow emitter region.

Next, the present invention will be described for a bipolar transistor using the semiconductor material doped to the level exceeding the solubility limit for its emitter region. Such a transistor has a high common emitter current gain even if the thickness of the base region is reduced.

Figure 5:
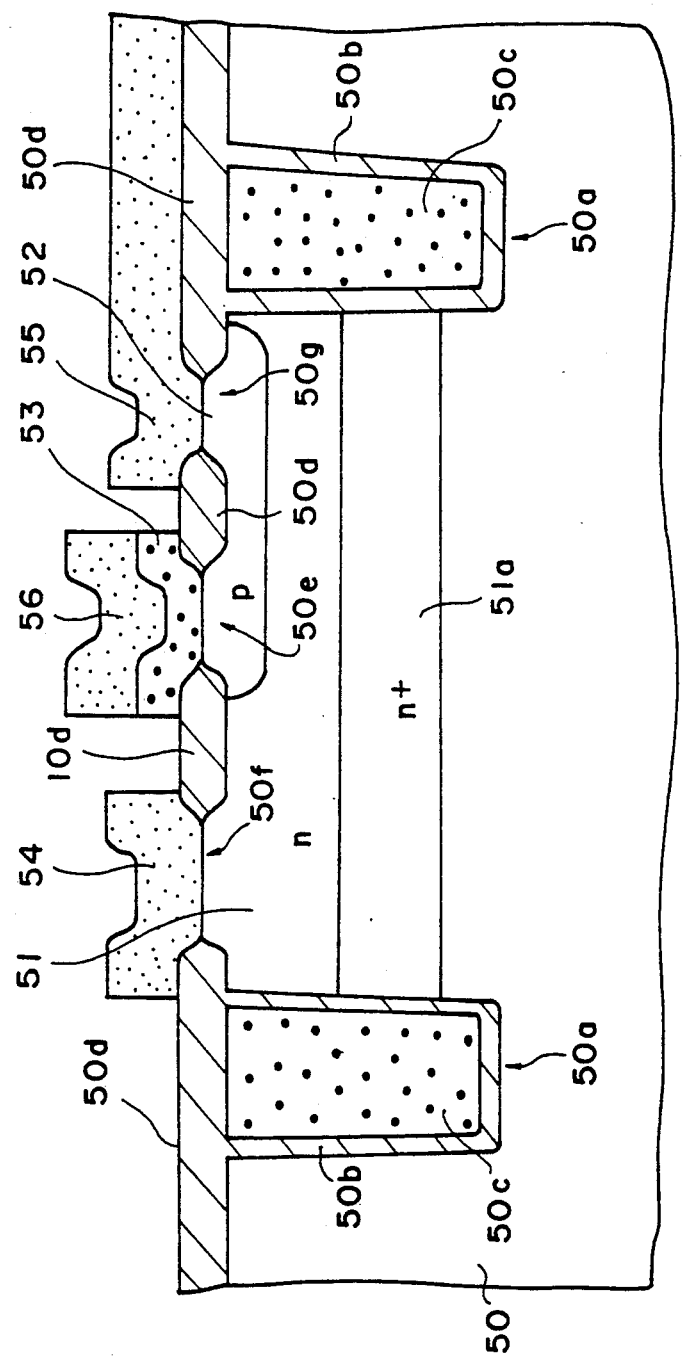
FIG. 5 is a cross sectional view showing a structure of a bipolar transistor which is another embodiment of the present invention.

Referring to FIG. 5, the bipolar transistor comprises a collector region 51 defined in a silicon substrate 50 by an isolating structure 50a and a buried collector layer 51a. In the illustrated example, the collector region 51 is doped by a group V element such as arsenic to the n-type. The isolating structure 50a is a known structure having an oxide wall 50b and isolates the region which it surrounds from other devices in the substrate 50. The space 50c defined in the isolating structure 50a by the oxide wall 50b is filled by a polysilicon. The buried collector region 51a is doped also by arsenic up to an n⁺ level so as to reduce the collector resistance.

A thin base region 52 is formed on a part of the surface of the collector region 51 as illustrated by ion implantation using a group III element such as boron as the dopant. Thus, the base region 52 is doped to the p-type. In order to improve the operational speed or response of the transistor, the thickness of the base region 52 is set to about 1000 Å which is substantially thinner as compared to the conventional thickness of the base region which is usually set to about 3000–4000 Å. Further, in order to cancel or compensate the effect of increased resistivity associated with such a thin base region, the base region 52 is doped to an impurity level of about $1 \times 10^{19}/cm^3$ so that the resistivity of the base region is reduced. Further, an emitter region 53 is formed on the surface of the base region 52 so that the emitter region 53 and the base region 52 make direct contact. The emitter region 53 has a thickness of about 3000 Å and comprises a polysilicon which is doped with a group V element such as arsenic to the n⁺-type as will be described. Each of the collector region 51, base region 52 and the emitter region 53 are connected to respective electrodes 54, 55 and 56.

In such a bipolar transistor, the common emitter current gain $h_{FE}$ is given by an equation:

$$h_{FE} = I_C/I_b = A \cdot n_e/n_p \exp(-_{66} Eg/kT) \quad (1)$$

where $I_C$ stands for collector current, $I_B$ stands for base current, A stands for a proportional coefficient, $n_p$ stands for the density of electron in the conduction band of the emitter region, and $n_p$ stands for the hole density in the valence band of the base region. $\Delta Eg$ stands for the difference in band gap of the semiconductor material at the base-emitter junction of the transistor. In conventional bipolar transistors having the base and emitter regions doped with boron and arsenic respectively, the band gap in the emitter region is generally equal to the band gap in the base region and the term $\exp(-\Delta g/kT)$ is about 1, although $\Delta E_g$ increases slightly in the positive direction when the level of the impurity in the emitter region is increased significantly due to the contraction of the band gap in the emitter region. Such a contraction of the band gap causes the decrease in the common emitter current gain $h_{FE}$.

From Equation (1), it can be easily understood that the common emitter current gain $h_{FE}$ increases when the number of electrons $n_e$ in the emitter region is increased relative to the number of holes $n_p$ in the the base region. This means that in order to obtain a bipolar transistor having a substantial gain, it is necessary that a large number of carrier, much larger than the number of carrier present in the base region, should be present in the emitter region. For this reason, the impurity level of the emitter region is usually made larger than the impurity level of the base region by a factor of about 1000.

In the transistor of FIG. 5, the impurity level of the base region 52 is about $1 \times 10^{19}/cm^3$ so as reduce the resistance. This means that in order to achieve a satisfactory operation of the transistor, the level of arsenic in the emitter region 53 should be at least in the order of $10^{22}/cm^3$ when a factor of 1000 is to be secured between the impurity level of the emitter region 53 and the base region 52. However, such a high impurity level in the emitter region 53 exceeds the solubility limit of arsenic in silicon, and when such a solubility limit is exceeded, there appears precipitate in the emitter region 53.

Figure 6:
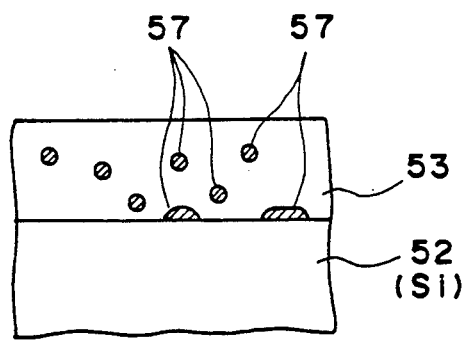
FIG. 6 is a cross sectional view showing an estimated structure of an emitter region of the transistor of FIG. 5 in which precipitates are appeared as a result of saturation of the impurity.

Referring to FIG. 1 again, it is obvious that at the impurity level exceeding $1 \times 10^{22}/cm^3$, the emitter 56 of the transistor of FIG. 5 cannot be a single phase and silicon arsenide appears as the precipitate in the silicon as already described. FIG. 6 shows such a precipitate 57 appeared in the polysilicon emitter region 53. Some of the precipitates may scatter in the polysilicon emitter region 53 in an isolated state while some of the precipitates may grow epitaxially on the surface of the base region 52. The existence of such precipitates distorts the crystal structure of the host silicon and is thought to provide deteriorative effect to the property of the transistor by scattering the carrier or by facilitating the recombination of the carrier.

Figure 7:
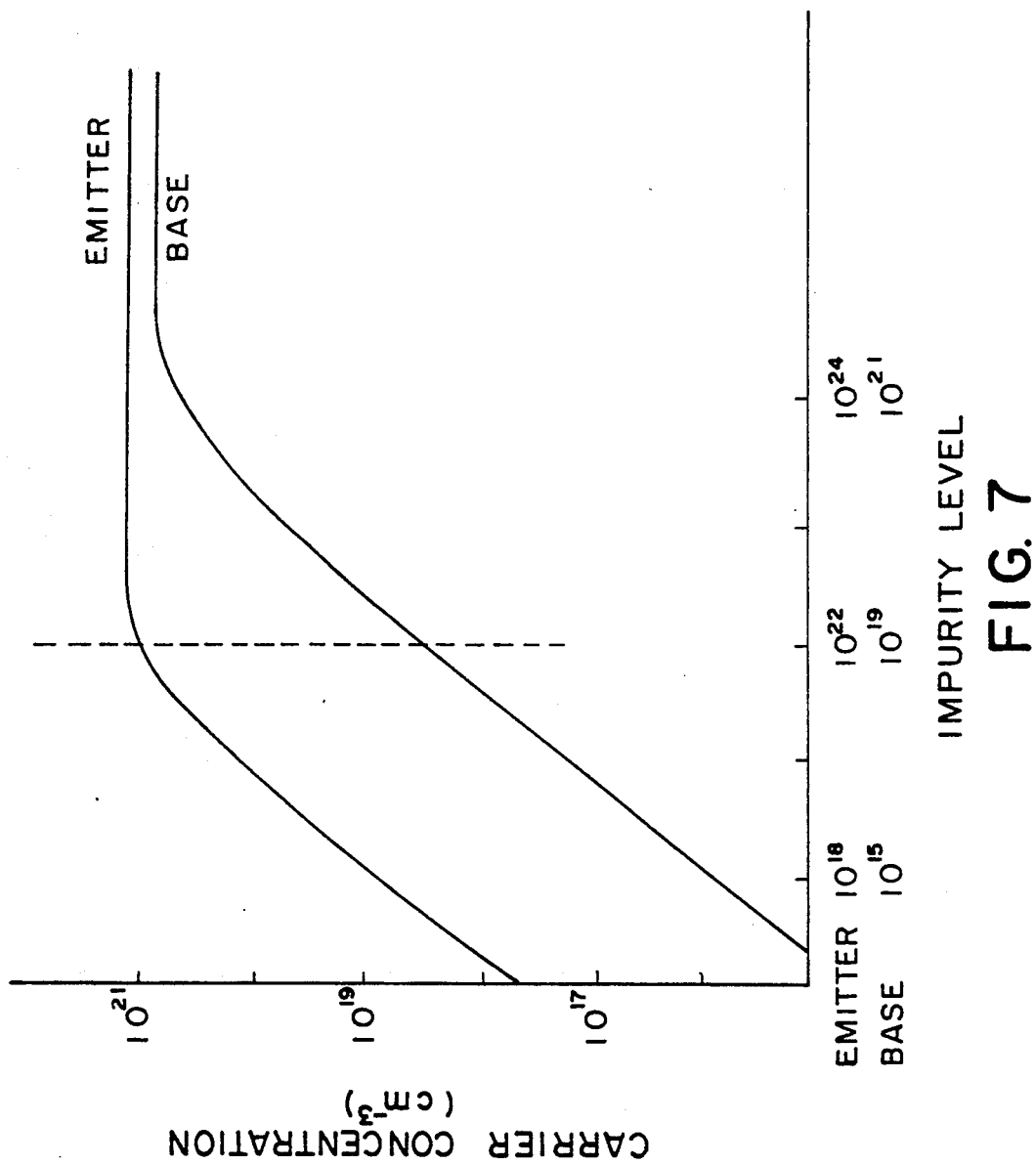
FIG. 7 is a diagram showing a relation of the carrier concentration in a base and an emitter region of a bipolar transistor.

As such a precipitate of silicon arsenide does not contribute to the creation of carrier, the addition of arsenic to the emitter region 53 beyond the solubility limit of arsenic in silicon does not increase the carrier concentration in the emitter region 53. FIG. 7 shows the change of carrier concentration in the base region 52 and the emitter region 53 as a function of impurity level in the respective regions. In the region in the graph in which the impurity level of the emitter and the base is low, the carrier concentration in the emitter region 53 and the base region 52 increases linearly with increasing impurity level. As already described, the impurity level of the emitter region 53 is made higher by a factor of 1000 than the impurity level of the base region 52, and corresponding thereto, the carrier concentration in the emitter region is 1000 times larger than the carrier concentration in the base region 52. However, when the impurity level of the emitter region 53 reaches the level of about $1 \times 10^{22}/cm^3$, the carrier concentration in the emitter region 53 does not increase any more as a result of precipitation of the silicon arsenide. Thus, the difference in the carrier concentration between the emitter region 53 and the base region 52 is decreased with increasing impurity level when the emitter region is doped beyond the solubility limit, and the common emitter current gain $h_{FE}$ is deteriorated as can be understood from Equation (1).

Figure 8:
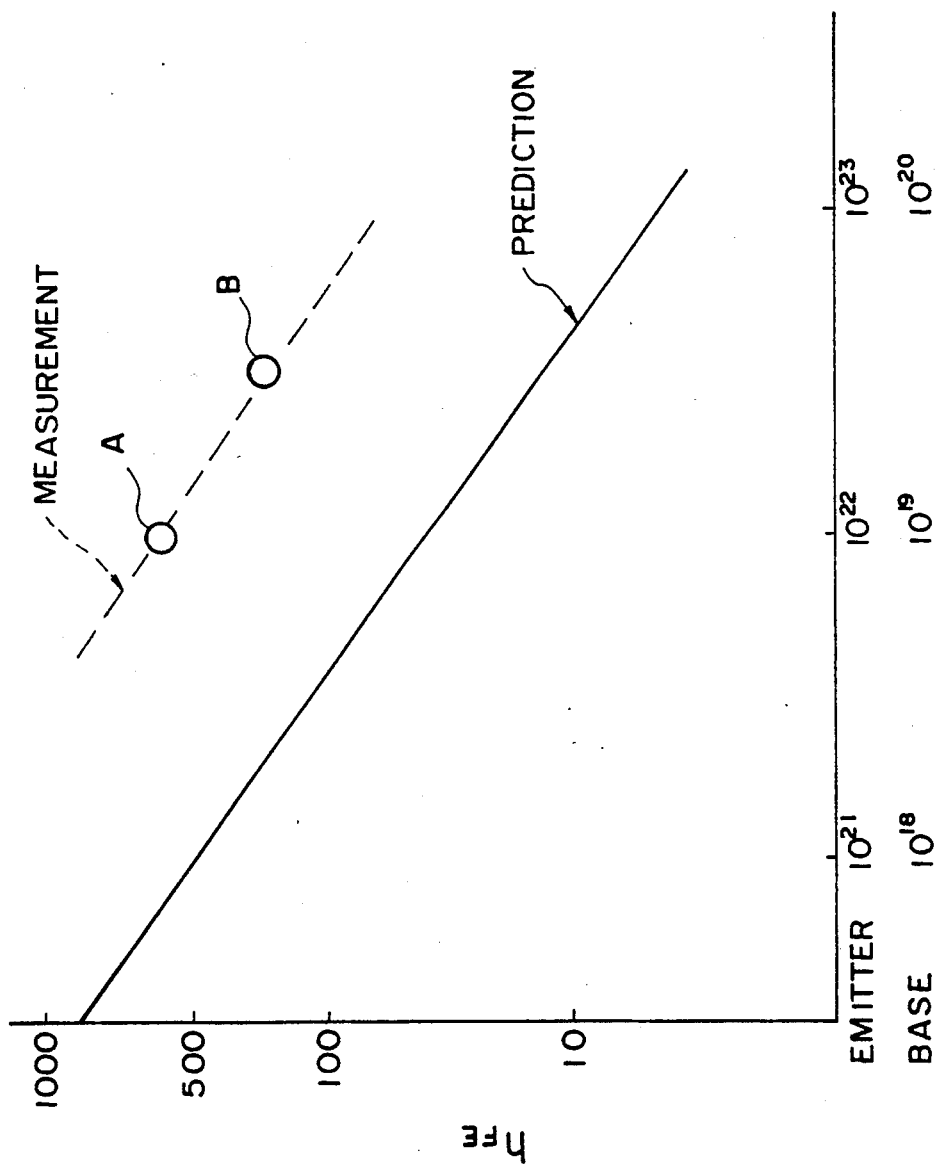
FIG. 8 is a graph showing a prediction of a common emitter current gain $h_{Fe}$ is a function of the impurity level of an emitter region and a base region of a bipolar transistor together with actually measured common emitter current gain.

FIG. 8 shows the result of simulation predicting the change of the common emitter current gain $h_{FE}$ in a conventional npn bipolar transistor as a function of the impurity level in the base region. In this simulation, the impurity level of the emitter region is assumed to be 1000 times higher than the impurity level of the base, the thickness of the emitter region 53 is assumed to be 1500 Å, the thickness of the base is assumed to be 2500 Å, and the thickness of the collector region 51 is assumed to be 1.8 μm. It can be clearly seen that the value of $h_{FE}$ decreases rapidly with increasing impurity level in the base region and in the emitter region. For example, the common emitter current gain $h_{FE}$ of the transistor having the base impurity level exceeding $1 \times 10^{19}/cm^3$ is expected to be substantially lower than 100.

Because of the reasons as set forth heretofore, conventional bipolar transistors avoided the use of the impurity level which invites the precipitation in the emitter region. This is the reason why the bipolar transistor having the emitter region doped to the impurity level in the order of $10^{19}/cm^3$ has never been constructed.

During the study of fast speed bipolar transistors, the applicant of the present invention dared to dope the emitter region 53 of the structure of FIG. 5 to a level exceeding the solubility limit of the arsenic in silicon.

Figure 9:
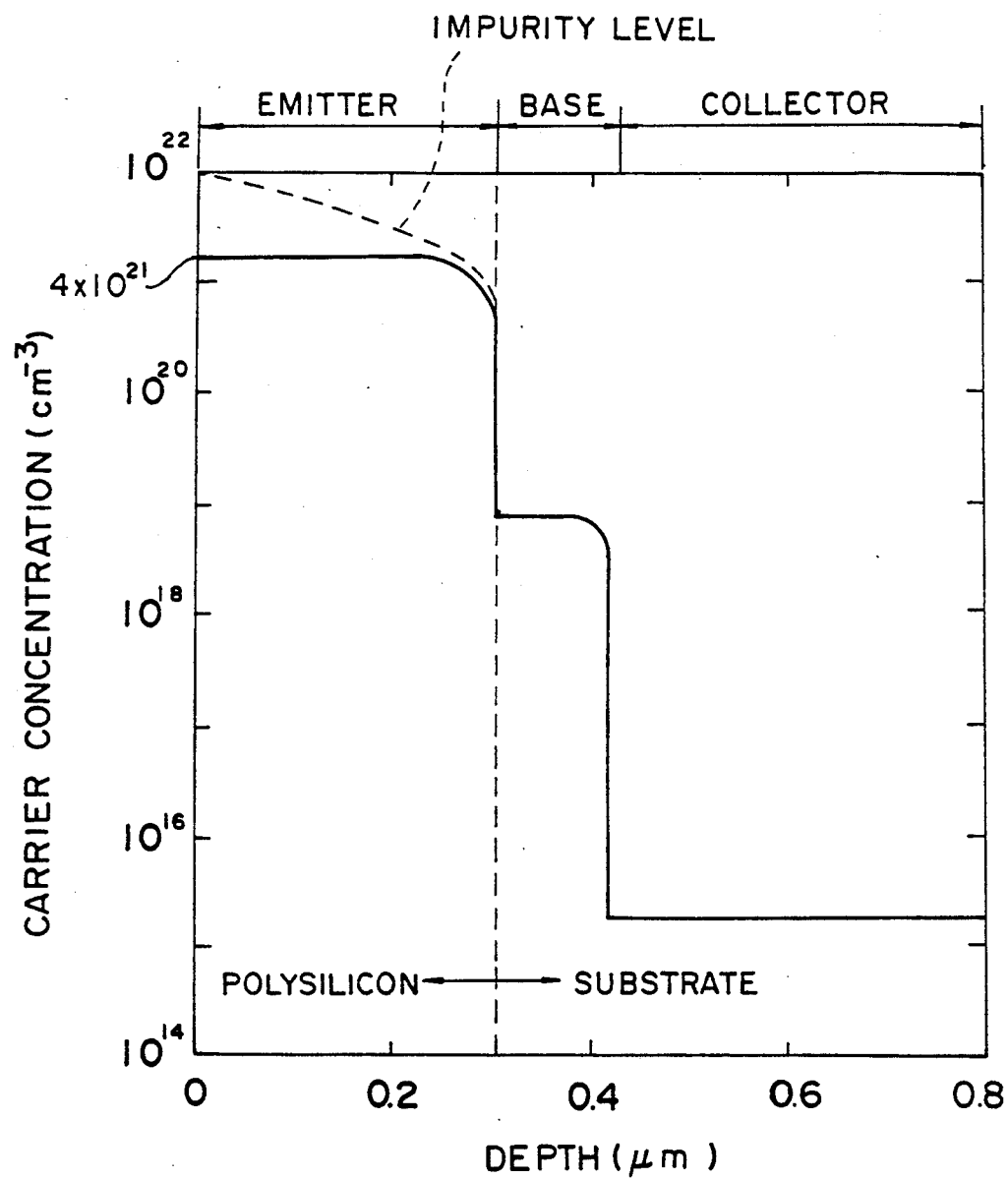
FIG. 9 is a diagram showing the carrier distribution in various parts of the bipolar transistor of FIG. 5.

In the experiment conducted by the applicant, the emitter region 53 having the thickness of about 3000 Å is subjected to ion implantation using arsenic ion As+ as the dopant under acceleration voltage of 100 keV. The amount of dose was $1 \times 10^{17}/cm^2$. The emitter region thus doped generally takes an amorphous structure and was then annealed at 850° C. for 30 minutes and later at 1500° C. for 30 seconds, together with other part of the transistor structure of FIG. 5. FIG. 9 shows the profile of impurity distribution and the corresponding carrier concentration in various part of the bipolar transistor of the present invention. It should be noted that the carrier concentration in the polysilicon emitter region 53 remains stationary with increase in the impurity level of the emitter region when the impurity level has exceeded the level of about $1 \times 10^{21}/cm^3$. Thus, the difference in the carrier concentration between the emitter region 53 and the base region 52 is about 100 which is usually thought to be too small for a satisfactory operation of bipolar transistor.

Surprisingly enough, the transistor thus obtained, having the base region 52 doped to the level of $10^{19}/cm^3$ and the emitter region 53 doped to the level of $10^{22}/cm^3$ which substantially exceeds the solubility limit of the arsenic in silicon, showed the common emitter current gain $h_{FE}$ of about 600 (data "A" in FIG. 8). Such a result is quite contradictory to what is believed hitherto for bipolar transistors. It should be noted that the common emitter current gain $h_{FE}$ of 600 is a satisfactory value for a bipolar transistor. Thus, the bipolar transistor of FIG. 5 having the base and emitter regions thus doped exhibits a high operational speed and still maintains a high common emitter current gain.

The reason why the bipolar transistor thus constructed can exhibit such a high common emitter current gain is not fully understood yet. One possible explanation is that the silicon arsenide precipitate having the formula of $SiAs_x$ has a band gap larger than that of silicon, and as a result, the common emitter current gain $h_{FE}$ is increased in accordance with the exponential term of Equation (1). When the band gap in the emitter region is larger than the band gap of the material forming the base region, the band gap difference $\Delta E_g$ in Equation (1) is increased in negative direction and as a result the exponential term increases the value of $h_{FE}$ against the effect of the term $n_e/n_p$ which tends to decrease the value of $h_{FE}$ because of the reason already described. For the band gap of silicon arsenide, various researches report a relatively large value, in the order of about 2 eV. Among others, Kunioka, Ho and Sakai for example report a value of 2.18 eV (Kunioka et al. J. Appl. Phys. Vol. 44, No. 4, April pp. 1895–1896, 1973). Chu, Kelm and Chu report a value of 2.2 eV (Chu et al. J. Appl. Phys. Vol. 43, No. 3, March pp. 1169–1173). Chu, Kunioka and Kelm report a value of 2.03 eV ("Electrical Properties of Melt-grown Silicon Monoarsenide", Solid State Electronics, Pergamon Press 1971, Vol. 14, PP. 1259–1263). Ing, Chiang and Haas report a value of 2.2 eV (Ing et al. J. Electrochem. Soc. SOLID STATE SCIENCE, pp. 761–762, July 1967). Lewerenz and Wetzel report a value of 1.42 eV (Lewerenz et al. J. Electrochem. Soc.: ACCELERATED BRIEF COMMUNICATION, pp. 1228–1230, May 1983). All of these values substantially exceed the band gap of silicon which is about 1.12 eV. Thus, it is plausible that the emitter region 53 of the transistor of FIG. 5 has a band gap substantially larger than the band gap of the base region 52 and as a result the decrease in the common emitter current gain $h_{FE}$ is compensated by the increase in the exponential term of Equation (1). In this case, the boundary between the emitter region 53 and the base region 52 forms a heterojunction, and the bipolar transistor operates as a hetero-bipolar transistor.

With further increase in the impurity level in the base region 52 and in the emitter region 53, the common emitter current gain $h_{FE}$ decreases slightly but still remains above 100 (about 120) even if the base region 52 is doped to the level of about $2 \times 10^{19}/cm^3$ and the emitter region 53 is doped to the level of about $2 \times 10^{22}/cm^3$ (point "B" of FIG. 5). On the contrary, the prediction indicates that the corresponding common emitter current gain $h_{FE}$ should be somewhere between 10 and 20.

Thus, the bipolar transistor of the present embodiment of the present invention achieves a high operational speed and a high common emitter current gain using an emitter doped with a group V element to the impurity level exceeding the solubility limit of the impurity in the emitter and a base correspondingly doped to a high level.

Further, the present invention is not limited to these embodiments, but various variations and modifications may be made without departing from the scope of the present invention.

What is claimed is:

1. A bipolar transistor comprising:
   a base region made of a single crystal silicon doped with a first impurity element of a first conductivity type to a first level;
   an emitter region made of silicon doped with a second impurity element of a second conductivity type to a second level larger than the first level, said second impurity element comprising an element capable of forming a silicon compound having a band gap that is larger than that of silicon, said emitter region containing a precipitate of said silicon compound at an interface between the base region and the emitter region such that the precipitate of said silicon compound forms a heterojunction at said interface; and
   a collector region made of silicon and doped with an impurity element of the second conductivity type.

2. A bipolar transistor as claimed in claim 1 in which said second impurity element comprises a group V element.

3. A bipolar transistor as claimed in claim 1 in which said second impurity element comprises arsenic.

4. A bipolar transistor as claimed in claim 3 in which said first impurity element boron, comprises said first level is at least larger than $1 \times 10^{19}/cm^3$.

5. A bipolar transistor as claimed in claim 4 in which the second level is at least $4 \times 10^{21}/cm^3$.

6. A bipolar transistor comprising:
   a substrate of a single crystal silicon, said substrate having upper and lower major surfaces;
   a collector region of a single crystal silicon formed in the substrate as apart thereof and having upper and lower major surfaces, said collector region being formed in the substrate such that the upper major surface thereof coincides with the upper major surface of the substrate and the lower major surface thereof is located above the lower surface of the substrate, said collector region being doped by a first impurity element of a first conductivity type to a first concentration level;
   a base region of a single crystal of silicon formed in the collector region as a part thereof and having upper and lower major surfaces, said base region being formed in the collector region such that the upper major surface thereof coincides with the upper major surface of the collector region and the lower major surface thereof is located above the lower major surface of the collector region, said base region being doped by a second impurity element of a second, opposite conductivity type to a second concentration level; and
   an emitter region provided on the upper major surface of the base region in contact therewith, said emitter region being doped with a third impurity element of said first type, said third impurity element forming a silicon compound which has a band gap larger than silicon when reacted with silicon, to a third level that is larger than the second level, said emitter region containing the silicon compound at an interface to the upper major surface of the base region such that the silicon compound establishes a heterojunction with the base region.

7. A bipolar transistor as claimed in claim 6 in which said impurity element comprises boron.

8. A bipolar transistor as claimed in claim 6 in which said impurity element comprises phosphorous.

9. A bipolar transistor as claimed in claim 6 in which said impurity element comprises arsenic.

* * * * *